United States Patent
Hshieh

Patent Number: 6,144,039
Date of Patent: Nov. 7, 2000

[54] LOW MELTING PADS FOR INSTANT ELECTRICAL CONNECTIONS

[76] Inventor: Fwu-Iuan Hshieh, 20768 Sevilla La., Saratoga, Calif. 95070

[21] Appl. No.: 09/081,739

[22] Filed: May 19, 1998

[51] Int. Cl.[7] .............................. H01L 23/58; H01L 23/48
[52] U.S. Cl. .......................... 257/48; 257/750; 257/781; 257/785
[58] Field of Search .............................. 257/48, 743, 744, 257/745, 753, 781, 785, 750

[56] References Cited

U.S. PATENT DOCUMENTS

| | | | |
|---|---|---|---|
| 3,984,261 | 10/1976 | Hawrylo | 148/33 |
| 4,395,727 | 7/1983 | Lauterbach | 357/71 |
| 4,735,662 | 4/1988 | Szabo et al. | 136/256 |
| 5,145,809 | 9/1992 | Walker | 437/203 |

*Primary Examiner*—Donald L. Monin, Jr.
*Attorney, Agent, or Firm*—Bo-In Lin

[57] ABSTRACT

The present invention discloses a pad for establishing instant electrical connection (PIEC) for in-line ion measurement device. The PIEC pad employs low-melting-point conductive materials, such as gallium or indium, as the attaching contact materials. The melting points of these materials can be below 160° C. The vapor pressures of these materials are generally lower than $10^{-5}$ mm Hg in the temperature range between 100–300° C. A PIEC pad is formed on a heavily doped semiconductor substrate covered with a metal layer. A layer of low-melting-point low-vapor-pressure material, e.g., gallium or indium, is then formed on the bottom of the heavily doped substrate. By heating a measuring device, the temperature is raised and the bottom low-melting attaching layer is melted and a good electric contact is established between the PIEC pad and the device for measurement A bonding wire is also formed on top of the metal layer. The bonding wire is electrically connected to a test or measuring electrode for current-voltage (I-V), capacitance-voltage (C-V) or other types of in-line testing or qualification measurements.

25 Claims, 5 Drawing Sheets

SILICON TEST WAFER

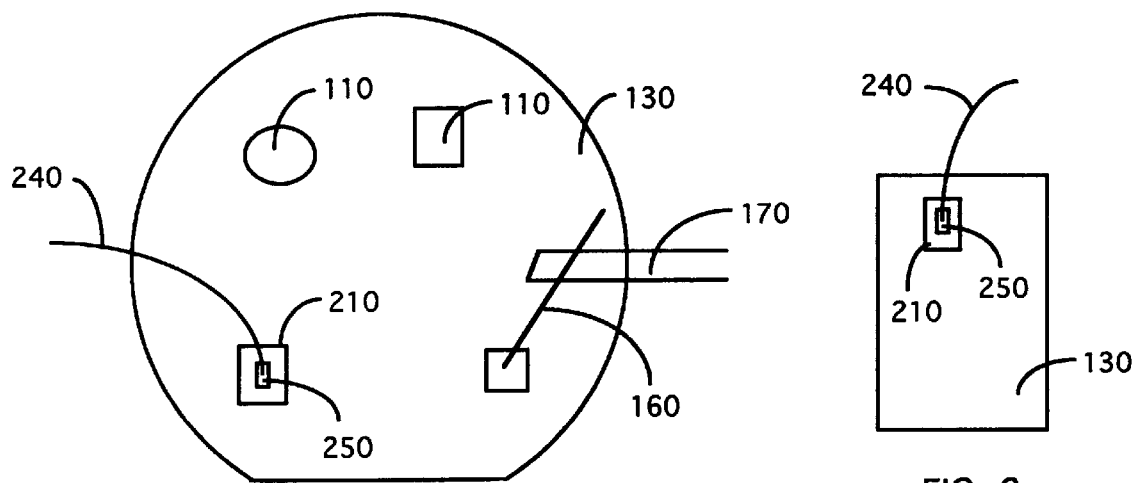
FIG. 5
FIG. 6
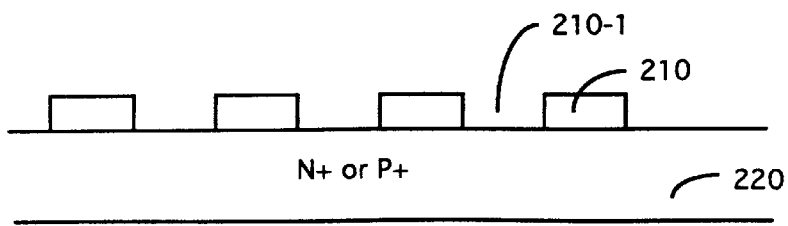
FIG. 7A
FIG. 7B
FIG. 7C

LOW MELTING PADS FOR INSTANT ELECTRICAL CONNECTIONS

BACKGROUND OF THE INVENTION

1. Field of the Invention

This invention relates generally to a contact probe employed for a semiconductor manufacturing in-line-monitoring process and for semiconductor device measurement More particularly, this invention relates to a low-melting contact pads for establishing instant electrical connections suitable for direct thin-film measurement without requiring preparation and pending time or using special fabrication equipment while achieving higher measurement accuracy.

2. Description of the Related Art

In order to control the ion contamination in a semiconductor-manufacturing environment, a time-consuming and difficult task of in-line measurement of mobile ions in a semiconductor wafer must be performed to qualify and continuously monitor the fabrication equipment This process is required due to the fact that the performance characteristics of an integrated circuit (IC) device is often adversely affected by mobile ion contamination introduced during the fabrication processes. Contamination of alkali metal ions, e.g., sodium and potassium ions, can affect the threshold voltage of a MOSFET device and degrade the gate oxide rupture voltage and channel mobility. Mobile ion contamination may also cause device reliability problem due to the fact that under an electrical bias, the contaminants move slowly at room temperature. But when the temperature is elevated, the mobile ions are moved at very high speed under the influence of the electrical field. Such a moving speed variation at different temperature of the contaminant ions often causes undesirable spurious performance characteristics and leads to reliability problems.

Since the undesirable mobile ions can be generated from a wide variety of sources such as human body, furnace, photo-resist, chemical etchants, etc., the fabrication equipment must first be qualified prior to wafer processing steps are carried out initially. The mobile ion density must also be closely monitored to control the contamination level during the entire fabrication process. Speed and accuracy of mobile ion measuring tools can have significant impact on the productivity and quality of the device manufacture. For those of ordinary skill in the art, there are several in-line measurements and probing techniques being applied for measuring and monitoring the mobile ion contamination.

A capacitance voltage (C-V) in-line measurement system is often employed in the industry. The mobile-ion contamination level is determined by measuring the parallel voltage shift ($\Delta V$) between the C-V curve before and after the bias temperature stress. The technique is based on the fact that the mobile ion density ($Q_m$) drifting from the metal-$SiO_2$ interface and the bulk oxide to $SiO_2$—Si interface at a given positive gate bias is proportional to the voltage shift ($\Delta V$), i.e., $Qm=C_{ox}\Delta V$. This measurement technique is very time-consuming since the C-V measurements before and after the stress are to be performed at room temperature while the bias stress measurement is to be carried out at an elevated temperature above 150° C. At least thirty minutes are required to complete this test due to the time wasted in waiting for the temperature to cool down to the room temperature when a conventional C-V measurement is carried out.

Another method for mobile ion measurement is carried out by the use of a triangular voltage sweep (TVS) technique. A triangular voltage ramp is applied to the gate and an ionic displacement current is measured at an elevated temperature. The contamination level is calculated from gate current due to the mobile ion drift from the oxide bulk to an interface of gate oxide and silicon. The mobile ion density, i.e., $Q_m$, drifting at a given temperature is proportional to the area under the peak in the gate current Ig caused by the ionic motion, i.e., $Q_m=\Sigma I_g \Delta V_g$ where $V_g$ is the gate bias. The TVS method, even that it requires more complicate analyses, can achieve higher speed of operation and is more accurate because unlike the C-V technique which employs two C-V curves to determine the mobile ion density while the TVS method only needs one I-V curve. Furthermore, the TVS measured sample can be maintained at an elevated temperature while taking data without requiring cooling off to room temperature. Additionally, when a TVS method is applied, the mobile ion density can be accurately measured without be affected by the interface trap normally formed at $SiO_2$—Si interface during an oxidation process. In contrast to C-V measurement, the interface trap density varies significantly due to heating, which in turn leads to a non-parallel voltage shift thus causing measurement inaccuracies. However, since the measurement technique involves an integration computation as explained above, an on-line computer is required with a computation-software and a data-entry device for carrying out the task of ion density measurements. Because different alkali ions have different drift rates, the peak gate current occurs at different gate bias, therefore different mobile ion species such as sodium and potassium, when measured by using the TVS method, can be separated at a given temperature. Both of the above two techniques require that the measurement to be performed at higher temperatures. Furthermore, there are still no contact or contactiess probes applying the above two techniques, which can measure the mobile ions directly.

FIG. 1A shows a mercury probe that is another contact probe commonly used for in-line process monitor in the industry. A mercury probe has been widely used for epitaxial (EPI) resistivity and oxide fixed charge measurement Due to the high vapor pressure at higher temperature and the concerns that the mercury vapor may induce health hazards, a mercury probe is not suitable for high-temperature mobile-ion measurement.

FIG. 1B shows a metal pin probe which is commonly used by first developing aluminum dots on wafers prior to applying a metal pin probe is applied for testing. Referring to FIG. 1C for the configuration of forming the aluminum dots with a metal deposition process on a silicon oxide layer on a silicon substrate for establishing an electric connection between the metal pin probe and the substrate. This requirement of metal dot development not only causes the equipment down time during the formation of these dots that takes at least eight hours. The metal deposition system for dot development may introduce unexpected mobile ions and cause physical damages to the wafer, which leads to inaccurate ion level measurements. Another limitation of the metal pin probe is the pin-slip from the dots caused by the thermal expansion of the wafer and the thermal chuck when there is a high temperature induced stress. The pin slip may often cause the inaccuracy in ion contamination measurement.

FIG. 1D shows a four-point probe including four sharp metal pins which is commonly employed for in-line sheet resistance measurement Such probe does not provide adequate measurement accuracy required espedally for shallow junction where the depth is dose to the probe damage range, e.g., 0.1 to 0.5 microns. For a shallow junction that is formed by rapid thermal annealing, the four-point probe does not provide sufficient accuracy for an in-line operation to monitor the ionimplant dosage.

Besides the above measuring techniques, a contactiess probe is not useful for the measurement of mobile ion contamination since the movement of mobile ions requires the presence of an electrical field. For the above reasons, there is still a need in the art of in-line process monitoring, e.g., mobile-ion measurement, to provide new and improved measurement techniques and devices to overcome the limitations and difficulties discussed above.

SUMMARY OF THE PRESENT INVENTION

One object of the present invention is to teach a novel measurement technique implemented with improved measurement contact pads whereby the limitations as encountered by the prior art can be overcome.

Another object of the present invention is to teach an in-line monitoring measurement technique implemented with new and improved measurement contact pads whereby measurement can be directly conducted without requiring the formation of aluminum dots on the wafers.

Another object of the present invention is to teach an in-line monitoring measurement technique implemented with new and improved measurement contact pads whereby direct electric connection can be established immediately. The in-line monitoring measurements can be performed safely without causing any safety concerns as that of a mercury probe.

Another object of the present invention is to teach an in-line monitoring measurement technique implemented with new and improved measurement contact pads whereby electrical connections can be instantly established. Measurement can be directly performed without the measurement inaccuracies caused by probe-pin slips.

Another object of the present invention is to teach an electrical measurement and monitoring technique implemented with new and improved measurement contact pads whereby electrical connections can be instantly established without requiring additional equipment other than a thermal chuck Measurement can be directly performed with minimum preparation time and carried out instantaneously with very simple processes and low measurement cost.

Briefly, in a preferred embodiment, the present invention is a pad for establishing instant electrical connection (PIEC) for in-line ion measurement device. The PIEC pad employs low-melting-point conductive materials, such as gallium or indium, as the attaching contact materials. The melting points of these materials can be below 160° C. The vapor pressures of these materials are generally lower than $10^{-5}$ mm Hg in the temperature range between 100–300° C. A PIEC pad is formed on a heavily doped semiconductor substrate covered with a metal layer. A layer of low-melting-point low-vapor-pressure material, e.g., gallium or indium, is then formed on the bottom of the heavily doped substrate. By heating a measuring device, the temperature is raised and the bottom low-melting attaching layer is melted and a good electric contact is established between the PIEC pad and the device for measurement A bonding wire is also formed on top of the metal layer. The bonding wire is electrically connected to a test or measuring electrode for current-voltage (I-V), capadtance-voltage (C-V) or other types of in-line testing or qualification measurements.

The present invention also discloses a method for manufacturing the PIEC pads as described above. A semiconductor wafer constituting a PIEC substrate is first heavily doped to obtain a substrate of a predefined low resistivity. A metal layer is sputtered on top of the heavily doped wafer and patterned along a plurality of scribed lines of the wafer. A low melting point attaching layer such as gallium or indium is formed on the bottom of the semiconductor wafer by either sputtering or evaporation process. The wafer is sawed along the scribe lines to form a plurality of PIEC pads. Each of the PIEC pads is then wire bonded to form a bonding pad on top of the metal layer with an bonding-wire attached to that bonding pad.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIG. 5 shows a testing configuration with a top view of the contact pads with a bonded connecting wire of the present invention disposed on top of a silicon or gallium substrate;

FIG. 6 shows another testing configuration with a top view of the contact pads with a bonded connecting wire of the present invention disposed on top of a glass substrate with a thin film devices on top;

FIGS. 7A to 7H are a series of cross-sectional views and top views for illustrating the manufacturing process of the instant low-melting-point contact pads of the present invention.

DETAILED DESCRIPTION OF THE PREFERRED EMBODIMENT

Figure 1A:
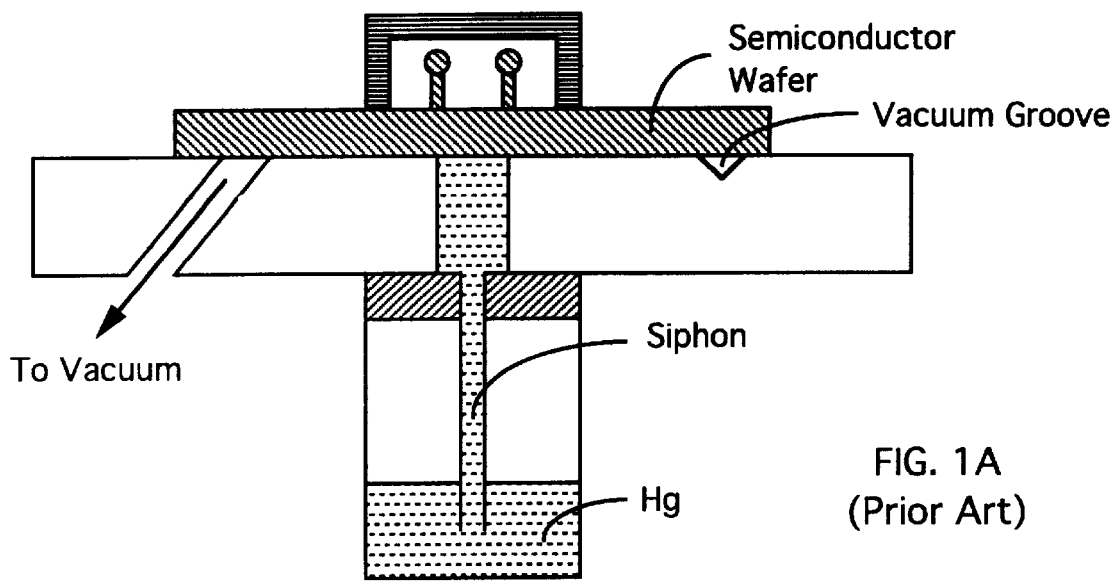
FIG. 1A shows a side cross-sectional view of a conventional mercury probe.
Figure 1B:
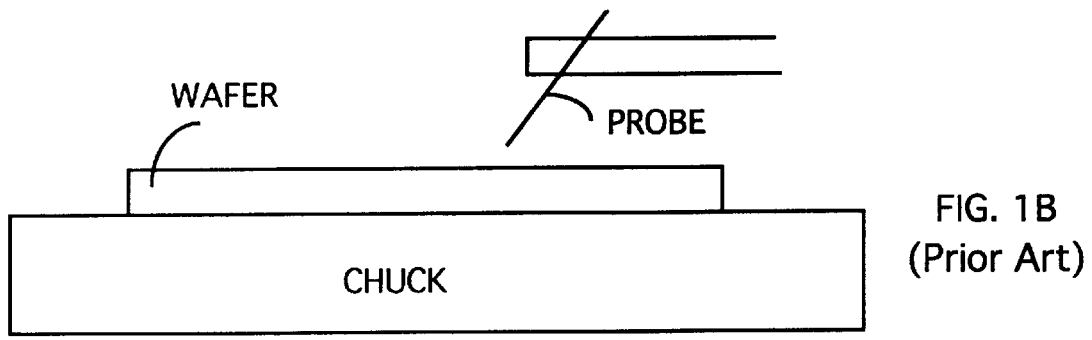
FIG. 1B shows a side cross-sectional view of a single metal pin probe.
Figure 1C:
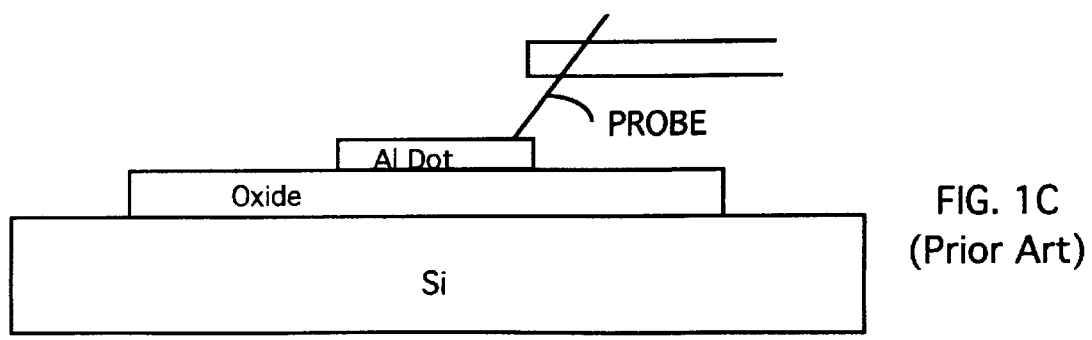
FIG. 1C shows a side cross-sectional view of a aluminum dot formed on a silicon substrate for connection to a metal pin probe.
Figure 1D:
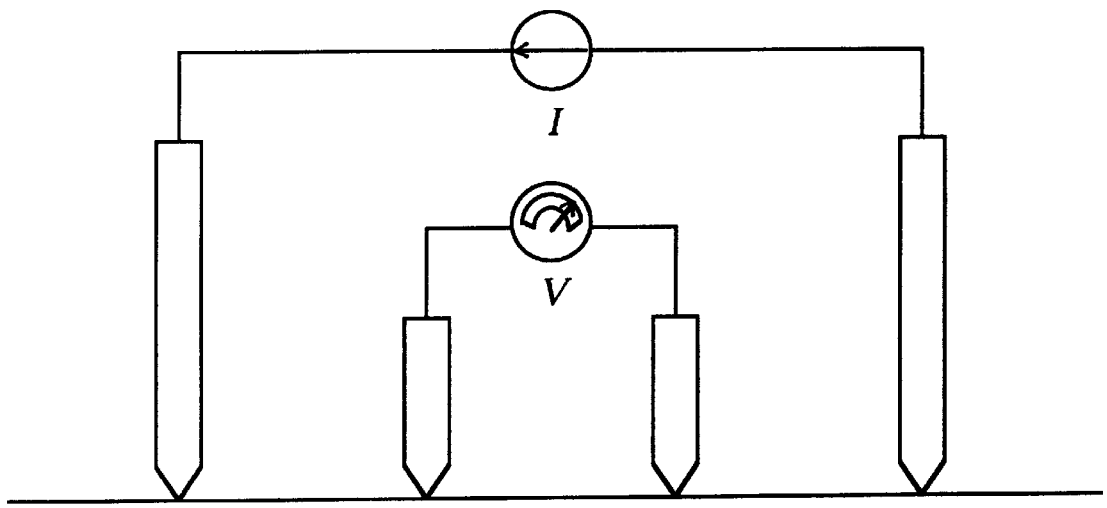
FIG. 1D shows a side cross-sectional view of a four-point probe for measuring sheet resistance.
Figure 2:
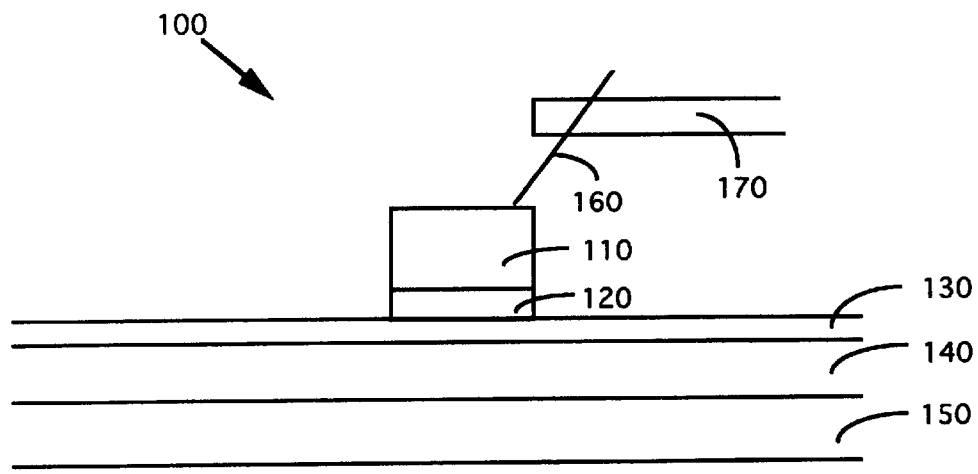
FIG. 2 shows a side cross-sectional view of a low-melting-point instant contact pad of the present invention.

Referring to FIG. 2 for a low-melting pad 100 for instant electrical connection of the present invention. The low-melting pad 100 includes a conductive-pad layer 110, e.g., an aluminum layer. A low-melting attaching layer 120 is formed underneath the conductive pad-layer 110. The low melting pad 100 is placed on top of a thin film 130, composed of either silicon oxide or metal, covering a layer of bulk semiconductor material 140 such as a silicon, GaAs or a glass substrate, etc. In order to establish a firm electric connection, a temperature control chuck 150 is placed underneath the substrate 140 to raise the temperature to a melting point such that the low melting attaching layer 120 is melted. A good contact is established between the low melting pad 100 and the thin film layer 130. A probe 160 contacts the top surface of the conductive pad layer 110. A probe holder 170 is in electric connection with the probe160 for carrying out required measurement.

Figures 3, 4:
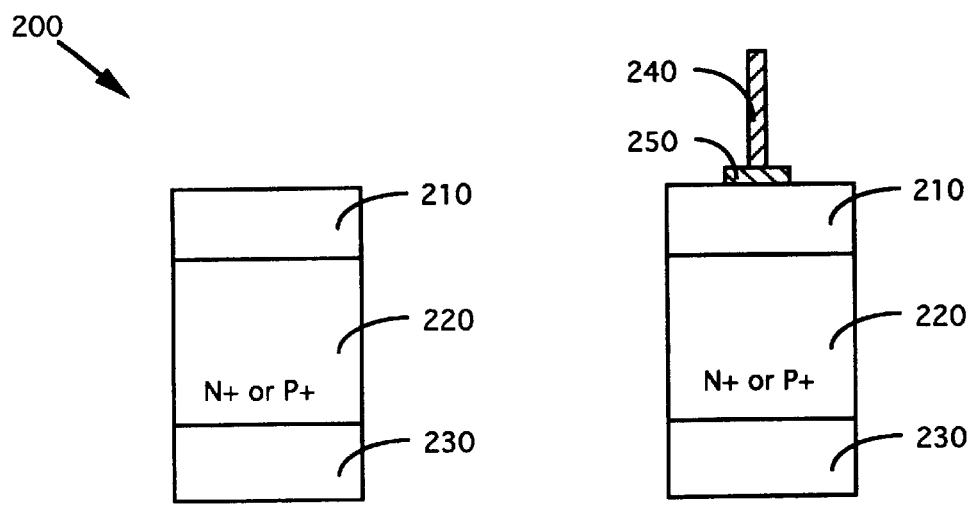
FIG. 3 shows a layer structure with a side cross-sectional view of the contact pad using low melting point metals of the present invention.
FIG. 4 shows a connection configuration with a side cross-sectional view of the contact pad with a bonded connecting wire of the present invention.

FIG. 3 shows a cross sectional view of an alternate preferred embodiment where a low-melting point pad 200 comprising three layers. A top metal layer 210 composed of metals such as aluminum, titanium, chromium, etc. is formed on top of a heavily doped P+ or N+ silicon layer. This heavily doped silicon layer 220 has a resistivity of 10 ohm-cm or less. The low-melting point pad 200 further includes a low-melting attaching layer 230 formed on the bottom composed of low melting material, e.g., indium or gallium which has melting point of 158° C. and 30° C. respectively. The low-melting point attaching layer can also be formed with low melting point alloys. FIG. 4 is a cross sectional view of the low-melting point pad 200 with a wire bonding of gold or aluminum wire 240 attached to the pad 200 via a bonding pad 250. The low-melting point attaching layer 230 has a thickness ranging from 500 Angstroms to ten micrometers.

According to FIGS. 2 to 4, this invention teaches a pad for instant electric connection (PIEC). This PIEC pad includes a conductive pad layer 220 having a bottom surface and a top surface. The PIEC pad further includes a low-melting point attaching layer 230 attached to the bottom surface of the conductive pad layer. The PIEC pad further includes a conductive metal layer 210 attached to the top surface of the conductive pad layer. In a preferred embodiment, the low-melting attaching layer is composed of a low-melting point conductive material with a melting point below 300° C. In a specific embodiment, the low-melting attaching layer is composed of gallium. In another specific embodiment, the low-melting attaching layer is composed of indium. In yet another embodiment, the low-melting attaching layer is composed of an electrically conductive alloy having a melting point below 300° C. In a specific embodiment, the conductive pad 220 layer is a layer of heavily doped semiconductor layer. In another specific embodiment, the conductive pad layer is a layer of N+ semiconductor layer. In yet another embodiment, the conductive pad layer is a layer of P+ semiconductor layer. The PIEC may further a bonding wire 160 attached on top of the conductive metal layer 210.

According to FIG. 2, this invention discloses a pad for instant electric connection (PIEC). This PIEC pad includes a conductive pad 110 having a bottom surface and a top surface. This PIEC pad further includes a low-melting point attaching layer 120 attached to the bottom surface of the conductive pad layer. In one of the preferred embodiment, the conductive pad is an aluminum pad.

According to FIG. 2, this invention further discloses a system 100 for establishing an instant electric connection to a surface of an electrical-measurement object. The system 100 includes a pad for instant electric connection (PIEC), which includes a conductive pad layer 110 having a bottom surface and a top surface. The PIEC further includes a low-melting point attaching layer 120 attached to the bottom surface of the conductive pad layer 110. The PIEC further includes a conductive metal layer, e.g., layer 210 shown in FIG. 3, attached to the top surface of the conductive pad layer. The system 100 further includes a temperature control means 150 for controlling a surface temperature of the surface of the electrical-measurement object 140 to melt the low-melting point attaching layer 120 for attaching the PIEC to the surface of the electrical-measurement object 140. In one of the preferred embodiment, the low-melting attaching layer 120 is composed of a low-melting point conductive material with a melting point below 300° C. In another preferred embodiment, the low-melting attaching layer 120 is composed of gallium. In another preferred embodiment, the low-melting attaching layer 120 is composed of indium. In another preferred embodiment, the low-melting attaching layer 120 is composed of an electrically conductive alloy having a melting point below 300° C. In another preferred embodiment, the conductive pad layer 110 is a layer of heavily doped semiconductor layer.

FIGS. 5 and 6 show the top-views of two application configurations of the low melting point pads. In FIG. 5, multiple pads for establishing instant electrical connection (PIECs) are applied on a silicon or GaAs substrate for various types of measurements. These multiple pads for instant electrical connection (PIECs) can be formed with different shapes and sizes. As shown in FIG. 5, the PIECs can be formed with square, rectangular, circular or other kinds of shapes. In FIG. 6, a PIEC is applied on a glass substrate with thin film devices wherein the PIEC is formed on the top surface. The PIEC as shown is also provided with a bonding wire for conveniently establishing electrical connection via the low-melting point pad.

The contact pads as shown above, e.g., contact pads 100 or 200 shown in FIGS. 2–6, when provided with a bonding wire can be conveniently connected to an electric probe or a test electrode. For performing the function of mobile ion measurements or system contamination monitoring, the low-melting point pads are placed on the surface of a semiconductor device for measurement The temperature of the thermal chuck is increased to a melting point such that the bottom low-melting attaching layer is melted. Then, by deactivating a thermal element of the thermal chuck, the temperature of the thermal chuck is decreased. The low-melting-point-attaching layer is solidified once the temperature is lowered below the melting point A good electric contact is established between the low-melting pad and the semiconductor device. The pads for instant electric connection, i.e., the PIEC pads, can then be connected to a measurement device, e.g., a C-V or I-V measurement device, for measuring and monitoring the ion densities in the thin film on the top surface of the wafer. Other than the mobile ion measurement, the I-V measurement can also be used to measure the Schottky barrier height of the metal semiconductor contact and the C-V curve can be used to measure the epitaxial (EPI) or the substrate doping concentration. The relative position of the PIEC pads can be flexibly arranged for the convenience of the probing and measurement functions to be conducted using these low melting point pads. In performing the contamination measurements or process monitoring operations, the contact area between the PECs and the wafer can be flexibly controlled by using PIEC of different sizes and shapes.

To monitor mobile ion contamination using either TVS (or I-V) or C-V method, a semiconductor wafer is heated up to 100 to 300° C. by the thermal chuck When the TVS method is applied, both the mobile ion contamination level and the element contents for different idnds of ions can be detected by referencing the I-V characteristics measured at elevated temperatures. When the C-V method is employed, temperature bias stress is to be applied to the wafer after the set-up temperature is reached. Following the application of the temperature stress bias, the thermal chuck is then cooled down to room temperature using circulated water and the C-V measurements are then carried out At the completion of all the monitoring or the required measurements, the low melting point PIECs are removed. It can be conveniently carried out by simply melting the bottom low-melting point attaching layer and then removing the PIEC pads.

Figure 7D:
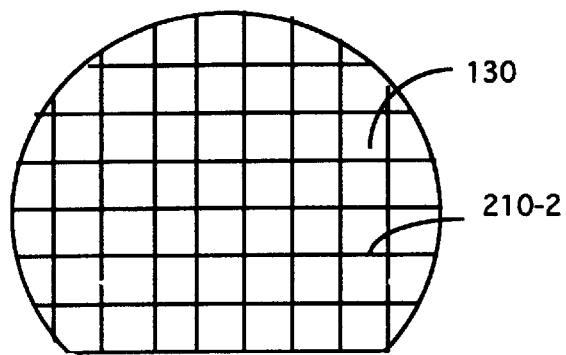

Referring to FIGS. 7A to 7 H for a series of cross section views or top views for illustrating the processing steps employed to manufacture the PIEC pads, e.g., pads 200, of this invention. In FIG. 7A, a semiconductor substrate, e.g., a silicon substrate 220 is implanted with P+ or N+ dopant ions to form a P+ or N+ substrate with a resistivity of 1.0 to 10 milli-ohm-cm. In FIG. 7B, a metal sputtering process is performed to form a metal layer 210, e.g., an aluminum or copper layer, on top of the heavily doped substrate 220. In FIGS. 7C and 7D, a mask is applied to pattern the metal layer 210 with predefined shape and size for each of the PIEC pads. The gap 210-1 is aligned with the scribe lines 210-2 (see the top view as shown in FIG. 7D).

Figure 7E:
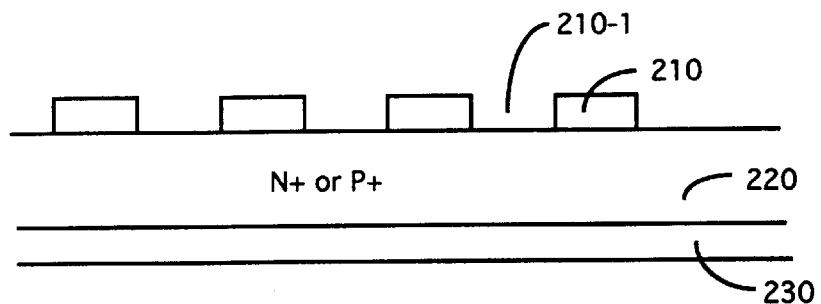
Figure 7F:
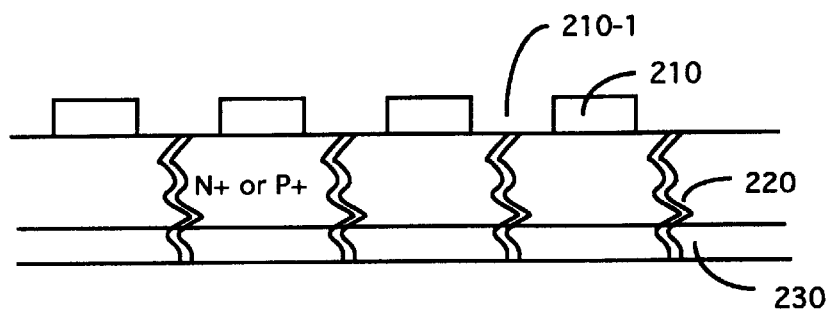
Figures 7G, 7H:
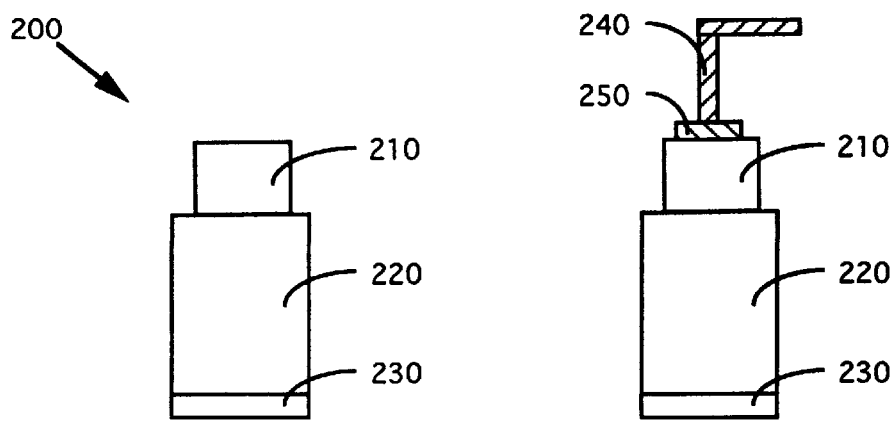

In FIG. 7E, a low-melting attaching layer 230 is formed on the bottom of the heavily doped substrate 220 by applying either a sputtering or evaporation process. The low melting point materials are metal or alloys, which have melting point below 300° C. such as a gallium, indium or gallium/indium alloy. In FIG. 7F, a saw operation is performed on the semiconductor wafer to separate the wafer along the scribe lines 210-2 to form individual PIEC pad 200 as that shown in FIG. 7G. In FIG. 7H, a wire bonding operation is carried to form a bonding wire 240 attached to a bonding pad 250 disposed on top of the metal layer 210.

According to FIGS. 7A to 7H and above descriptions, this invention discloses a method for manufacturing a pad for instant electric connection (PIEC). The method includes the steps of (a) doping a semiconductor wafer for providing a predefined resistivity; (b) depositing a metal layer on top of the semiconductor wafer; and (c) depositing a low-melting conductive layer on bottom of the semiconductor wafer. The method further includes the steps of (d) patterning the metal layer and defining scribe lines for the semiconductor wafer; and (e) separating the semiconductor wafer along the scribe lines for forming a plurality of PICE pads. In another preferred embodiment, the method further includes the step (f) of forming a bonding wire on the PIEC pads. In one of the preferred embodiment, the step (c) of depositing a low-melting conductive layer on bottom of the semiconductor wafer is a step of depositing a low-melting point conductive material with a melting point below 300° C. In one of the preferred embodiment, the step(c) of depositing a low-melting conductive layer on bottom of the semiconductor wafer is a step of depositing a gallium layer. In one of the preferred embodiment, the step (c) of depositing a low-melting conductive layer on bottom of the semiconductor wafer is a step of depositing a indium layer. In one of the preferred embodiment, the step (c) of depositing a low-melting conductive layer on bottom of the semiconductor wafer is a step of depositing a layer of electrically conductive alloy having a melting point below 300° C.

Therefore, the present invention teaches a novel measurement technique implemented with improved measurement contact pads such that the limitations encountered by the prior art are eliminated. Specifically, new in-line monitoring measurement techniques implemented with new and improved measurement contact pads are employed to achieve direct measurement without requiring the formation of aluminum dots on the wafers. By using the pad for: instant electric connection (PIEC), direct electric connection can be established immediately. The in-line monitoring measurements can be performed safely without causing any safety concerns as that of a mercury probe. The measurements can be directly performed without the measurement inaccuracies caused by probe-pin slips. Electric connections can be instantly established without requiring additional equipment other than a thermal chuck Measurement can be directly performed with minimum preparation time and carried out instantaneously with very simple processes and low measurement cost.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A pad for instant electric connection (PIEC) comprising:

a conductive pad layer having a bottom surface and a top surface;

a low-melting point attaching layer attached to said bottom surface of said conductive pad layer;

a conductive metal layer attached to said top surface of said conductive pad layer; and said conductive pad layer is a layer of heavily doped semiconductor layer.

2. The PIEC of claim 1 wherein:

said conductive pad layer is a layer of N+ semiconductor layer.

3. The PIEC of claim 1 wherein:

said conductive pad layer is a layer of P+ semiconductor layer.

4. The PIEC of claim 1 further comprising:

a bonding wire attached on top of said conductive metal layer.

5. The PIEC of claim 1 wherein:

said low-melting attaching layer is composed of a low-melting point conductive material with a melting point below 300° C.

6. The PIEC of claim 1 wherein:

said low-melting attaching layer is composed of gallium.

7. The PIEC of claim 1 wherein:

said low-melting attaching layer is composed of indium.

8. The PIEC of claim 1 wherein:

said low-melting attaching layer is composed of an electrically conductive alloy having a melting point below 300° C.

9. A pad for instant electric connection (PIEC) comprising:

a conductive pad having a bottom surface and a top surface;

a low-melting point attaching layer attached to said bottom surface of said conductive pad layer; and said conductive pad further includes a layer of heavily doped semiconductor layer.

10. The PIEC of claim 9 further comprising:

a bonding wire attached on top of said conductive pad.

11. The PIEC of claim 9 wherein:

said conductive pad further comprising a metal layer.

12. The PIEC of claim 9 further comprising:

said conductive pad further comprising an aluminum layer.

13. The PIEC of claim 9 wherein:

said conductive pad further includes a conductive metal layer attached to said top surface of said conductive pad.

14. The PIEC of claim 9 wherein:

said low-melting attaching layer is composed of a low-melting point conductive material with a melting point below 300° C.

15. The PIEC of claim 9 wherein:

said low-melting attaching layer is composed of an electrically conductive alloy having a melting point below 300° C.

16. A system for establishing an instant electric connection to a surface of an electrical-measurement object, the system comprising:

a pad for instant electric connection (PIEC), which includes a conductive pad layer having a bottom surface and a top surface;

said PIEC further includes a low-melting point attaching layer attached to said bottom surface of said conductive pad layer;

said PIEC further includes a conductive metal layer attached to said top surface of said conductive pad layer; and a temperature control means for controlling a surface temperature of said surface of said electrical-measurement object to melt said low-melting point attaching layer for attaching said PIEC to said surface of said electrical-measurement object.

17. The system of claim 16 wherein:

said low-melting attaching layer is composed of a low-melting point conductive material with a melting point below 300° C.

18. The system of claim 16 wherein:

said low-melting attaching layer is composed of gallium.

19. The system of claim 16 wherein:

said low-melting attaching layer is composed of indium.

20. The system of claim 16 wherein:

said low-melting attaching layer is composed of an electrically conductive alloy having a melting point below 300° C.

21. The system of claim 16 wherein:

said conductive pad layer is a layer of heavily doped semiconductor layer.

22. The system of claim 16 wherein:

said conductive pad layer is a layer of N+ semiconductor layer.

23. The system of claim 16 wherein:

said conductive pad layer is a layer of P+ semiconductor layer.

24. The system of claim 16 further comprising:

a bonding wire attached on top of said conductive metal layer.

25. The system of claim 16 wherein:

said temperature control means is a temperature control chuck.

* * * * *